United States Patent
Hannour et al.

(10) Patent No.: US 8,101,858 B2
(45) Date of Patent: Jan. 24, 2012

(54) CHALCOPYRITE SEMICONDUCTOR BASED PHOTOVOLTAIC SOLAR CELL COMPRISING A METAL SUBSTRATE, COATED METAL SUBSTRATE FOR A PHOTOVOLTAIC SOLAR CELL AND MANUFACTURING METHOD THEREOF

(75) Inventors: Fouzia Hannour, Haarlem (NL); José Reyes Flores Ramírez, Haarlem (NL); Gijsbertus Cornelis van Haastrecht, Heemskerk (NL)

(73) Assignee: Corus Technology B.V., Ijmuiden (NL)

( * ) Notice: Subject to any disclaimer, the term of this patent is extended or adjusted under 35 U.S.C. 154(b) by 1355 days.

(21) Appl. No.: 11/437,830

(22) Filed: May 22, 2006

(65) Prior Publication Data
US 2007/0261733 A1 Nov. 15, 2007

(30) Foreign Application Priority Data

Mar. 14, 2006 (EP) .................................... 06075612
May 15, 2006 (EP) .................................... 06009922

(51) Int. Cl.
*H01L 31/00* (2006.01)
(52) U.S. Cl. ......... 136/264; 136/255; 136/256; 136/265
(58) Field of Classification Search ................... 136/256, 136/264, 265, 255
See application file for complete search history.

(56) References Cited

U.S. PATENT DOCUMENTS

| 3,351,698 | A | * | 11/1967 | Marinace | 174/16.3 |
| 4,612,411 | A | * | 9/1986 | Wieting et al. | 136/265 |
| 5,477,088 | A | * | 12/1995 | Rockett et al. | 257/764 |
| 5,518,867 | A | * | 5/1996 | Anderson et al. | 430/363 |
| 2005/0098205 | A1 | * | 5/2005 | Roscheisen et al. | 136/263 |
| 2006/0237059 | A1 | * | 10/2006 | Kurihara et al. | 136/263 |

FOREIGN PATENT DOCUMENTS

| JP | 2005-079031 | * | 3/2005 |
| WO | 0157932 | | 8/2001 |
| WO | 2005096395 | | 10/2005 |

OTHER PUBLICATIONS

Perry's chemical engineering handbook, seventh edition, 1997, pp. 2-7 and 2-27.*
JP 2005-079031 (abstract translation).*
Material Safety Data Sheet of Vanadium Pentoxide, Jun. 1994.*

* cited by examiner

*Primary Examiner* — Basia Ridley
*Assistant Examiner* — Thanh-Truc Trinh
(74) *Attorney, Agent, or Firm* — Novak Druce + Quigg, LLP

(57) ABSTRACT

A chalcopyrite semiconductor based photovoltaic solar cell. This cell comprises a metal substrate. A conductive layer is present between the metal substrate and a chalcopyrite semiconductor. The conductive layer has a crystal structure fitting to the crystal structure of the chalcopyrite semiconductor. Also disclosed is a coated metal substrate, in particular a metal strip for producing the individual metal substrates of a solar cell, as well as a manufacturing method thereof.

6 Claims, 1 Drawing Sheet

US 8,101,858 B2

CHALCOPYRITE SEMICONDUCTOR BASED PHOTOVOLTAIC SOLAR CELL COMPRISING A METAL SUBSTRATE, COATED METAL SUBSTRATE FOR A PHOTOVOLTAIC SOLAR CELL AND MANUFACTURING METHOD THEREOF

CROSS REFERENCE TO RELATED APPLICATIONS

This claims priority under 35 USC 119 from European patent application no. 06075612.9 filed Mar. 14, 2006 and European patent application no. 06009922.3 filed May 15, 2006, both incorporated herein by reference in their entirety.

FIELD OF THE INVENTION

According to a first aspect the invention relates to a chalcopyrite semiconductor based photovoltaic solar cell comprising a metal substrate, a conductive layer being present between a chalcopyrite semiconductor and the metal substrate. If required, a diffusion barrier layer may be present between the metal substrate and conductive layer. The invention also relates to a metal support for producing such a solar cell, as well as to a manufacturing method thereof.

BACKGROUND OF THE INVENTION

Chalcopyrite (sometimes also referred to as chalcogenide and abbreviated to CIS) semiconductors are known in the art. They have the general formula $Cu(In,Ga)(Se,S)_2$ and are used in thin film approaches for manufacturing solar cells. In these solar cells the chalcopyrite semiconductors acts as absorber layers for polycrystalline thin film solar cells. In these approaches the substrate of the entire module is coated with the required layers. Then the individual cells are dimensioned e.g. using a laser. Although the efficiency of these thin film solar cells having a CIS semiconductor is high compared to amorphous silicon based thin film solar cells, the costs are also high, which makes them less attractive.

Attempts have been made to manufacture a flexible solar cell using a metal e.g. a copper or brass substrate. A copper or brass substrate is expensive. Furthermore diffusion of copper atoms from the copper or brass substrate into the semiconductive layer could affect the performance of the solar cell. Therefore a diffusion barrier layer is electroplated on the metal substrate. Because the diffusion barrier is an electrical insulator, this requires a conductive contacting layer from specific metals and/or alloys to be applied on top of the diffusion barrier layer, as described in WO 01/57932. Additionally electroplating of both diffusion barrier and contacting layers makes the manufacturing process complex and expensive.

WO 2005/096395 discloses a coated metal substrate for a photovoltaic cell, wherein the coating comprises an essentially pore free layer of metallic molybdenum or molybdenum alloy that has been applied by a physical vapour deposition process.

It has also been observed that there is a risk of detachment of the semiconductor from the metal substrate substantially deteriorating the lifetime of the device.

Consequently, there is a general need for a flexible CIS based solar cell having improved properties with respect to stability and total efficiency. In addition, there is a need to provide a relative cheap and simple manufacturing process.

SUMMARY OF THE INVENTION

It is an object of the invention to provide a flexible chalcopyrite semiconductor based photovoltaic solar cell eliminating or reducing one or more of the above drawbacks, or at least to provide a useful alternative.

It is an additional object of the invention to provide a chalcopyrite semiconductor based photovoltaic solar cell having a metal substrate having improved properties, in particular with regard to stability of the device and conductive behaviour of the layer contacting the CIS semiconductor.

It is a further object of the invention to provide such a chalcopyrite semiconductor based photovoltaic solar cell that is relatively simple and/or relatively cheap to manufacture.

It is yet another object of the invention to provide a metal support for a photovoltaic solar cell, in particular having a strip shape, that is relatively simple, respectively relatively cheap to manufacture.

Still another object of the invention is to provide a method of manufacturing such a metal support.

According to a first aspect of the invention the chalcopyrite semiconductor based photovoltaic solar cell comprises a metal substrate and a chalcopyrite semiconductor, a conductive layer being present between the metal substrate and the chalcopyrite semiconductor, wherein the conductive layer has a crystal structure fitting to the crystal structure of the chalcopyrite semiconductor. Dependent on the composition of the metal substrate, the solar cell may require a diffusion barrier layer to be present on top of the metal substrate.

In the solar cell according to the invention the conductive layer adjoining the chalcopyrite semiconductor has a crystal structure that fits to the crystal structure of the chalcopyrite semiconductor. A thin transition film is present between the conductive layer and the chalcopyrite semiconductor, wherein the crystal lattice of the film is similar, e.g. identical (hetero-epitaxy) to that of the conductive layer. As a result a coherent interface is present between the bulk of the conductive layer and the bulk of the semiconductor, which offers an increased stability of the solar cell and an improved adhesion between these components. Without being bound to theory, it is assumed that the similar crystallographic orientation actually helps to improve the bonding of the respective layers, thereby reducing the risk of detachment. The more similar structure they have, the better the bonding will be. Advantageously the coefficients of thermal expansion of the two materials have the same order of magnitude, thereby reducing the (micro)tensions/stresses that may be induced during the subsequent application of the chalcopyrite semiconductor layer(s). Furthermore the electrical conductivity may be enhanced and consequently an improved performance of the solar cell is achieved.

Here it is noted that in the context of the present specification "fitting" has the meaning of substantially matching crystal structures including non-identical crystal structures, as will become apparent hereinbelow.

Preferably the chalcopyrite semiconductor comprises a p type CIS semiconductor.

In a further preferred embodiment the chalcopyrite semiconductor has a cubic structure. Advantageous examples thereof comprise CuInS and CuInSe being p type CIS semiconductor materials having a bcc structure (comprising two interpenetrating fcc sublattices).

Here it is also noted that the term "conductive layer" is not limited to conductors such as metals and metal alloys traditionally used as so called back contacts e.g. Ag, Au, Cu, Mo, brass and the like, but also includes semiconductive materials. Semiconductive materials of the n type are preferred for the conductive layer.

The conductive layer supporting the chalcopyrite semiconductor and fitting to the cubic structure thereof may comprise a similar structure. Preferably, the conductive layer comprising an n type semiconductive material has a substantially octahedral or orthorhombic (deformed cubic) structure. A corner of this structure seems to fit into the face of the bcc structure, thereby achieving an intimate bond at the interface of the conductive layer and the semiconductor causing an increased stability. The octahedral structure may be slightly distorted.

In a further preferred embodiment of the invention the conductive layer comprises a vanadium oxide based compound. Examples thereof comprise vanadium pentoxide ($V_2O_5$, orthorhombic, (010) oriented), other conductive vanadium oxides and vanadium phosphorous oxides (abbreviated to VPO hereinafter) having various P:V ratios such as $(VO)_2P_2O_7$. The VPO can be simply obtained from precursors like $(VO)(PO_3)_2$, $VOPO_4$, and $VOHPO_4.0.5H_2O$. The conductivity of these semiconductive materials is dependent on the chemical structure. Preferred examples are $V_2O_5$ and $(VO)_2P_2O_7$, the conductivity thereof allowing to waive an additional metal back contact layer.

A metal substrate requiring a diffusion barrier layer, can be obtained in any convenient way e.g. by coating or surface treatment of a metal layer. Coating is a preferred method. Advantageously a diffusion barrier layer like $SiO_2$ or $Al_2O_3$ is used in order to prevent elements diffusing from the metal substrate to the semiconductor. At the same time such a diffusion barrier may provide electrical insulation. Use of electrically insulating vanadium (phosphorous) oxides ($V_nO_{2n-1}$ such as VO, $VO_2$ and $V_2O_3$ being insulators dependent on temperature) is also possible. A gradual transition from insulating vanadium oxide adjacent the metal layer to conductive vanadium (phosphorous) oxide is another option.

A conductive diffusion barrier e.g. based on Cr optionally in combination with Ni compensating the thermal expansion coefficient difference between substrate and chalcopyrite semiconductor can also be used. Such a conductive diffusion barrier may advantageously be used in solar cells according to the invention having a metal substrate that has to be protected in order to prevent diffusion therefrom, wherein multiple cells are connected in series in a so called stacked configuration to be described hereinafter. If a metal substrate is used showing no diffusion, the diffusion barrier can be omitted.

In a preferred embodiment the action of the vanadium (phosphorous) oxide is further enhanced by selection of the material for the diffusion barrier layer. A preferred example thereof comprises a layer of molybdenum oxide, preferably $MoO_3$. $MoO_3$ is preferred because in addition to its diffusion barrier properties, it co-activates $V_2O_5$, partially due to its similar orthorhombic structure (preferred orientation 110). As $MoO_3$ is an electrical insulator, $V_2O_5$ can offer the required electrical conductivity. A similar co-activation is observed when catalytically active VPO systems on $MoO_3$ are used in the oxidation of hydrocarbons.

Metal substrates are flexible and lighter, resulting in cost reduction in handling and transport. Additionally, metal substrates are able to withstand the high process temperatures required for annealing the deposited CIS semiconductor. In a preferred embodiment the metal substrate consists of steel, stainless steel, copper or brass. Carbon steel is more preferred in view of costs.

In a further preferred embodiment the concept of matching crystal structures is extended to additional layers such as an intrinsic semiconductor, on top of the chalcopyrite semiconductor. Examples thereof comprise other cubic structures like intrinsic ZnO or InS.

On top of the intrinsic semiconductor a light transparent layer is present as the metal substrate at the bottom of the solar cell structure is not light transparent. A transparent conductive oxide such as $TiO_2$ or n-ZnO is a suitable example thereof.

According to a second aspect of the invention a coated metal substrate for a photovoltaic solar cell is provided, in particular a solar cell according to the invention as described above, which coated metal substrate comprises a semiconductive coating layer having a substantially octahedral or orthorhombic structure, in particular a semiconductive coating of a vanadium oxide based compound, and a metal substrate. The coated metal substrate according to the invention can be used in manufacturing of a solar cell, wherein the semiconductor to be subsequently applied and the coating layer show a coherent interface as explained above. Furthermore the vanadium oxide based compound can sustain the high process temperatures in the 450 to 550° C. range, that are encountered in applying a CIS layer. It is noted that the coated metal support is also useful for amorphous silica semiconductors.

The preferred embodiments discussed with respect to the solar cell according to the invention are similarly applicable to the coated metal substrate according to the invention.

Advantageously the coated metal substrate according to the invention has a roughness of less than 1 micrometer.

Preferably the coated metal substrate according to the invention has a strip shape. A strip of this kind can be easily manufactured in a roll to roll process, from which individual coated metal substrates for the solar cell production can be obtained. This offers a cost advantage over the piece by piece coating of a metal substrate. The metal strip can have a width of a few times ten to a few times hundred millimetres or more, and a length of several hundred meter or more.

According to a third aspect the invention relates to a method for producing a coated metal substrate suitable for producing photovoltaic solar cells, the method comprising the steps of:

a) providing metal substrate, preferably having a strip shape; and b) applying a layer of a semiconductive layer having a substantially octahedral or orthorhombic structure, in particular of a vanadium oxide based compound on the metal substrate.

As already said the conductive coating layer can be easily applied in a roll to roll process. The way in which the semiconductive layer is applied onto the metal substrate is not limited. For example, a vanadium pentoxide layer can be deposited by spraying an aqueous solution of the compound. The solvent preferably water can be dehydrated at a relatively low temperature, although the vanadium pentoxide can withstand high temperatures up to about 690° C. allowing faster and more powerful removal of the solvent. Powder spraying is a suitable alternative. $(VO)_2P_2O_7$ can be applied in a similar way, e.g. by applying a solution of $VOHPO_4.0.5H_2O$, followed by precipitating and curing at about 350° C. In a preferred embodiment the layer of vanadium oxide based compound is applied in a continuous manner.

If necessary, a diffusion barrier layer is applied to a metal substrate between steps a) and b). The method preferably comprises the further steps of:

c) applying a layer of a chalcopyrite semiconductor on the conductive layer;

d) providing a transparent layer of a n-type semiconductor; and e) providing a transparent protective top coating layer.

As the metal layer is not transparent, light has to be able to reach the absorbing chalcopyrite semiconductor from the opposite side. Therefore the layers on top of the semiconductor(s) need to be transparent. The additional layers applied in steps c) and d) can be applied using techniques commonly used in the art for obtaining these layers. If desired, a transparent layer of an intrinsic semiconductor is applied between steps c) and d). In general, a transparent conductive layer (metal electrode) will be applied on top of the n-type semiconductor. The assembly of layers is advantageously protected against the environment by a top coating layer which increases the lifetime of the device, reduces ageing and corrosion.

BRIEF DESCRIPTION OF THE DRAWINGS

The invention is illustrated in more detail with reference to the attached drawings, wherein.

DETAILED DESCRIPTION OF THE PREFERRED EMBODIMENTS

Figure 1:
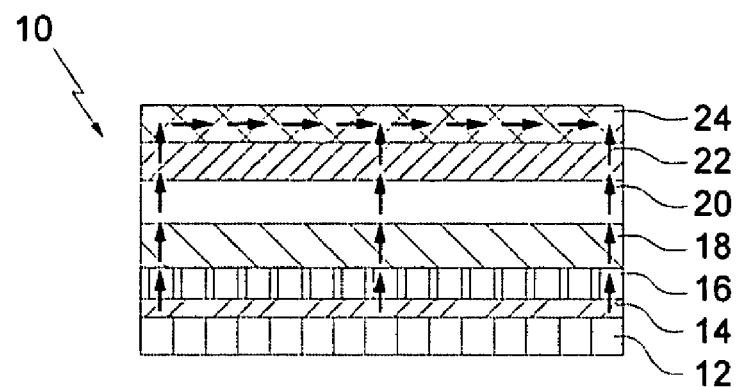
FIG. 1 shows a first embodiment of a photovoltaic cell according to the invention.

In the embodiment shown in FIG. 1, a photovoltaic cell according to the invention is indicated in its entirety by reference numeral 10. The cell 10 comprises a carbon steel strip 12 as a metal substrate, upon which a diffusion barrier layer 14 of molybdenum oxide is present. The cell 10 further comprises a conductive layer 16 of n type semiconductive vanadium pentoxide on top of the diffusion barrier layer 14, the layer 16 serving as back contact of the solar cell 10 in this embodiment. A p type CIS semiconductor 18 contacts the upper face of the layer 16. A transparent i type semiconductor layer 20 of ZnO is located on top of the absorbing semiconductor 18 in order to bridge the gap between the semiconductor 18 and an TCO (transparent conductive oxide) layer 22. An electrode grid 24 for collecting the electricity generated e.g. made from Ni or Al is present on top of this layer 22. An encapsulating resin layer (not shown) is usually provided for protection of the functional layers of the photovoltaic cell 10. The flow of electrons is indicated by arrows.

As an individual photovoltaic cell offers a small voltage, typically the cells are connected in series to achieve a reasonable voltage. The commonly used design to connect multiple cells in series is by internal patterning the (semi)conductive electrode layers.

Figure 2:
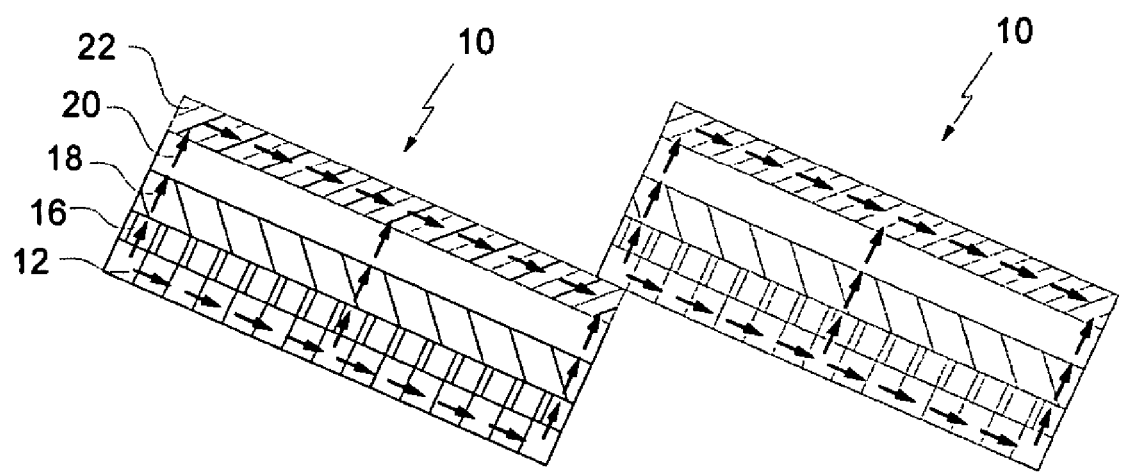
FIG. 2 shows a second stacked embodiment of photovoltaic cells according to the invention.

In another approach for high end cells which is advantageously applied to the photovoltaic cells according to the invention as shown in FIG. 2, the individual cells 10 are stacked like tiles such that a metal substrate of one cell serves as the lower contact of the adjacent cell. Functional layers in the layout of FIG. 2 similar to those of FIG. 1 are indicated by the same reference numerals. In more detail, a metal substrate 12 not requiring a diffusion barrier is directly coated with a conductive layer 16. On top thereof a p type CIS semiconductor layer 18 is present, which on its turn supports an i type semiconductor layer 20 and a TCO layer 22. At one end this TCO layer directly contacts the metal substrate of a subsequent cell, thereby allowing to omit a top electrode grid.

The invention claimed is:

1. Chalcopyrite semiconductor based photovoltaic solar cell comprising:
   a metal substrate and
   a planar chalcopyrite semiconductor layer having opposed first and second planar sides,
   a planar conductive layer having opposed first and second planar sides between the metal substrate and the chalcopyrite semiconductor,
   a transparent i-type semiconductor layer comprising zinc oxide and having opposed first and second sides; and
   a diffusion barrier layer between the metal substrate and the conductive layer,
   wherein the diffusion barrier layer comprises $MoO_3$,
   wherein the conductive layer has a crystal structure fitting to the crystal structure of the chalcopyrite semiconductor,
   wherein the chalcopyrite semiconductor comprises a p type CIS semiconductor,
   wherein the conductive layer comprises an n-type vanadium pentoxide;
   wherein the first side of the chalcopyrite semiconductor layer directly contacts the second layer of the planar conductive layer and the second side of the chalcopyrite semiconductor layer directly contact the second layer of the transparent i-type semiconductor layer.

2. Solar cell according to claim 1, wherein the chalcopyrite semiconductor has a cubic crystal structure.

3. Solar cell according to claim 1, wherein the chalcopyrite semiconductor is made from CuInS or CuInSe.

4. Solar cell according to claim 1, wherein the conductive layer has a substantially or orthorhombic structure.

5. Solar cell according to claim 1, wherein the metal substrate consists of carbon steel.

6. Solar cell according to claim 1, wherein the metal substrate has a strip shape.

* * * * *